(12) United States Patent
Nakamura

(10) Patent No.: US 7,605,058 B2
(45) Date of Patent: Oct. 20, 2009

(54) WAFER DIVIDING METHOD

(75) Inventor: Masaru Nakamura, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 12/122,952

(22) Filed: May 19, 2008

(65) Prior Publication Data

US 2008/0293218 A1 Nov. 27, 2008

(30) Foreign Application Priority Data

May 24, 2007 (JP) .............................. 2007-137645

(51) Int. Cl.
*H01L 21/00* (2006.01)
(52) U.S. Cl. ...................................... 438/464; 438/455
(58) Field of Classification Search ......... 438/455–465, 438/106–127, 33; 219/121.72
See application file for complete search history.

(56) References Cited

U.S. PATENT DOCUMENTS

| 6,939,741 | B2 * | 9/2005 | Fukuoka et al. ............. 438/114 |
| 7,015,055 | B2 * | 3/2006 | Oohata et al. ................. 438/22 |
| 7,329,564 | B2 * | 2/2008 | Nakamura et al. .......... 438/113 |
| 7,341,926 | B2 * | 3/2008 | Nakamura ................... 438/463 |
| 7,439,162 | B2 * | 10/2008 | Norimoto et al. ........... 438/464 |
| 2002/0192927 | A1 * | 12/2002 | Yamada ...................... 438/460 |
| 2005/0170616 | A1 * | 8/2005 | Murata et al. ............... 438/463 |
| 2005/0282359 | A1 * | 12/2005 | Nagai et al. .................. 438/459 |
| 2007/0141955 | A1 * | 6/2007 | Masuda ........................ 451/11 |
| 2008/0176491 | A1 | 7/2008 | Sekiya |
| 2008/0190902 | A1 * | 8/2008 | Nakamura ............. 219/121.67 |
| 2008/0293218 | A1 * | 11/2008 | Nakamura ................... 438/460 |
| 2008/0293320 | A1 * | 11/2008 | Severance, Jr. ................ 445/35 |

FOREIGN PATENT DOCUMENTS

JP 3408805 3/2003

OTHER PUBLICATIONS

English language Abstract of JP 2002-192370, Jul. 10, 2002.

* cited by examiner

*Primary Examiner*—Savitri Mulpuri
(74) *Attorney, Agent, or Firm*—Greenblum & Bernstein, PLC

(57) ABSTRACT

A wafer dividing method is provided that includes a protective plate sticking step of sticking the face of the wafer to the face of a protective plate by a pressure sensitive adhesive material whose adhesive force is decreased by an external stimulus; a degeneration layer formation step of throwing a laser beam, which permeates the wafer, along the street to the back side of the wafer, thereby forming a degeneration layer of a thickness corresponding to at least the finished thickness of the device within the wafer, the degeneration layer starting at the face of the wafer; a back grinding step of grinding the back of the wafer to form the wafer into the finished thickness of the device; a wafer support step of sticking the back of the wafer to a surface of a dicing tape mounted on an annular frame; an adhesive force decreasing step of imparting an external stimulus to the pressure sensitive adhesive material, thereby decreasing the adhesive force of the pressure sensitive adhesive material; a protective plate peeling step of peeling the protective plate from the face of the wafer; and a wafer rupture step of imparting an external force to the wafer, thereby rupturing the wafer along the street.

2 Claims, 6 Drawing Sheets

(a)

(b)

(a)

(b)

WAFER DIVIDING METHOD

FIELD OF THE INVENTION

This invention relates to a wafer dividing method for dividing a wafer, which has devices formed in a plurality of regions demarcated by a plurality of streets formed in a lattice pattern on the face of the wafer, into the individual devices along the plurality of streets.

DESCRIPTION OF THE PRIOR ART

In a semiconductor device manufacturing process, a plurality of regions are demarcated by division-scheduled lines, called streets, which are arranged in a lattice pattern on the face of a nearly disk-shaped semiconductor wafer. Devices, such as IC's and LSI's, are formed in these demarcated regions. The semiconductor wafer is cut along the streets, whereby the regions having the devices formed therein are divided to produce the individual devices. An optical device wafer having a gallium nitride-based compound semiconductor or the like laminated on the surface of a sapphire substrate is also cut along the streets, and divided thereby into individual optical devices such as light emitting diodes and laser diodes. These devices are widely used for electrical equipment.

As a method for dividing a plate-shaped workpiece such as a semiconductor wafer, an attempt has been made, in recent times, at a laser processing method as disclosed in Japanese Patent No. 3,408,805. According to this laser processing method, a pulsed laser beam of a wavelength permeating the workpiece is used, and the workpiece is irradiated with the pulsed laser beam, with the focused spot of the pulsed laser beam being in registry with the interior of the region where division should be performed. The dividing method using this laser processing method divides the workpiece by throwing the pulsed laser beam in an infrared region, which permeates the workpiece, from the side of one surface of the workpiece, while bringing the focused spot of the pulsed laser beam into registry with the interior of the workpiece, to form a degeneration layer continuously along the street within the workpiece, and exerting an external force along the division-scheduled line where strength has decreased upon formation of the degeneration layer, thereby dividing the workpiece.

To achieve the light weight and compactness of electrical equipment, demands have been made in recent years that the wafer be formed in a thickness of 100 µm or less. If the wafer is formed in a thickness of 100 µm or less, however, warpage occurs in the outer periphery of the wafer and, even when the wafer is held by a chuck table of a laser processing apparatus, its outer periphery warps upward. This makes it difficult to bring the focused spot of the laser beam into registry with a predetermined position within the wafer held by the chuck table. The problem also arises that after the laser beam is thrown along the street at the interior of the wafer formed in a small thickness to form the degeneration layer within the wafer along the street, the wafer breaks along the degeneration layer, when the wafer is withdrawn from the chuck table of the laser processing apparatus and transported to a subsequent step.

In the light of the above facts, the inventor tried a method comprising sticking the face side of the wafer to a glass sheet, grinding the back of the wafer to form the wafer into the finished thickness of the device, and then throwing a pulsed laser beam of a wavelength, which permeates the wafer, along the street to the back side of the wafer, with the face side of the wafer being stuck to the glass sheet, thereby forming a degeneration layer within the wafer along the street. However, the inventor suffered difficulty in positioning the focused spot of the laser beam within the thin wafer.

SUMMARY OF THE INVENTION

It is an object of the present invention to provide a wafer dividing method which can form the degeneration layer reliably along the street at a predetermined position within the wafer, and which can also transport the wafer safely even when the wafer is formed in a small thickness.

According to the present invention, as the method for attaining the above object, there is provided a wafer dividing method for dividing a wafer, which has devices formed in a plurality of regions demarcated by a plurality of streets formed in a lattice pattern on a face of the wafer, into the individual devices along the plurality of streets, comprising:

a protective plate sticking step of sticking the face of the wafer to a face of a protective plate by a pressure sensitive adhesive material whose adhesive force is decreased by an external stimulus;

a degeneration layer formation step of throwing a laser beam, which permeates the wafer, along the street from a back side of the wafer having the face stuck to the protective plate, thereby forming a degeneration layer of a thickness corresponding to at least a finished thickness of the device within the wafer, the degeneration layer starting at the face of the wafer;

a back grinding step of grinding a back of the wafer subjected to the degeneration layer formation step, to form the wafer into the finished thickness of the device;

a wafer support step of sticking the back of the wafer subjected to the back grinding step to a surface of a dicing tape mounted on an annular frame;

an adhesive force decreasing step of imparting an external stimulus to the pressure sensitive adhesive material sticking the wafer, which was subjected to the wafer support step and has been stuck to the surface of the dicing tape, to the protective plate, thereby decreasing the adhesive force of the pressure sensitive adhesive material;

a protective plate peeling step of peeling the protective plate from the face of the wafer after execution of the adhesive force decreasing step; and a wafer rupture step of imparting an external force to the wafer stuck to the dicing tape after execution of the protective plate peeling step, thereby rupturing the wafer along the street where the degeneration layer has been formed.

Preferably, the protective plate comprises a glass sheet, and the adhesive force decreasing step throws ultraviolet radiation to a side of the protective plate to which the face of the wafer has been stuck.

During the wafer support step, an adhesive film for die bonding may be interposed between the surface of the dicing tape and the back of the wafer.

According to the present invention, the degeneration layer formation step is performed when the wafer is in a thick state before the wafer is formed into the finished thickness of the device. Thus, the outer periphery of the wafer does not warp upward. Since the wafer is thick, moreover, it becomes easy to position the focused spot of the laser beam within the wafer. Hence, the degeneration layer can be formed reliably within the wafer along the street. Furthermore, the wafer is formed thinly in the finished thickness of the device by performed the back grinding step. However, the wafer does not break during its transport from the grinding apparatus to the next step, since the wafer is stuck to the protective plate.

DETAILED DESCRIPTION OF THE PREFERRED EMBODIMENT

Preferred embodiments of the wafer dividing method according to the present invention will be described in detail by reference to the accompanying drawings.

Figure 1:
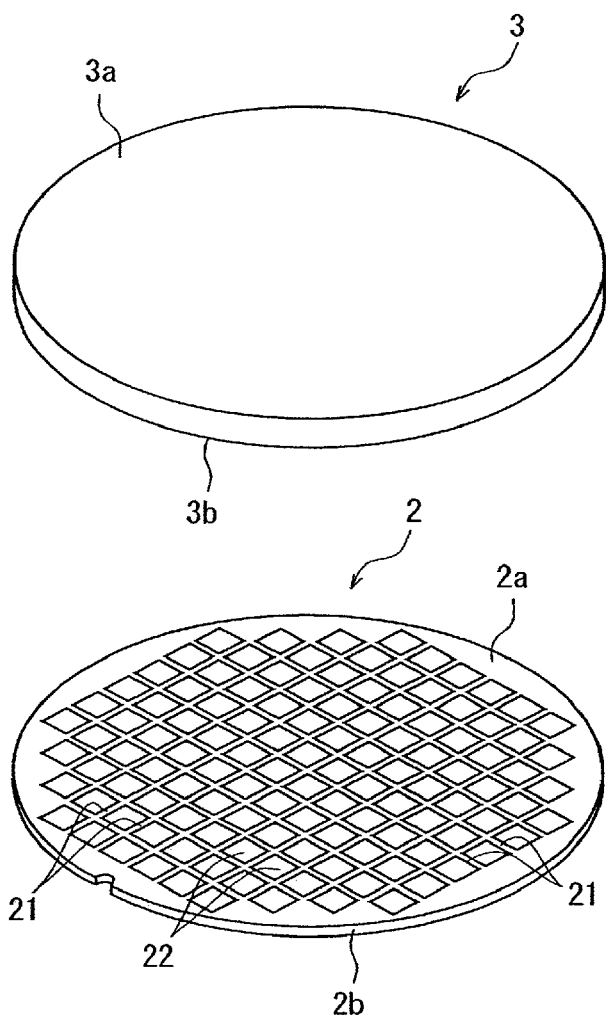
FIG. 1 is a perspective view of a semiconductor wafer as a wafer to be divided by the wafer dividing method according to the present invention, and a protective plate to which the wafer is stuck.

FIG. 1 shows a perspective view of a semiconductor wafer as a wafer to be divided according to the present invention, and a protective plate to which the wafer is stuck. A semiconductor wafer 2 shown in FIG. 1 comprises, for example, a silicon wafer having a thickness of 700 μm. A plurality of regions are demarcated by a plurality of streets 21 formed in a lattice pattern on the face 2a of the semiconductor wafer 2, and devices 22, such as IC's and LSI's, are formed in these demarcated regions. A protective plate 3 is formed in the shape of a disk from a material having high rigidity, such as a glass sheet, and its face 3a and back 3b are flattened. The protective plate 3 preferably has a thickness of the order of 1 to 3 mm, if it is constituted of a glass sheet. As a material constituting the protective plate 3, a ceramic, a metallic material such as stainless steel, resin or the like can be used other than the glass sheet.

Figure 2:
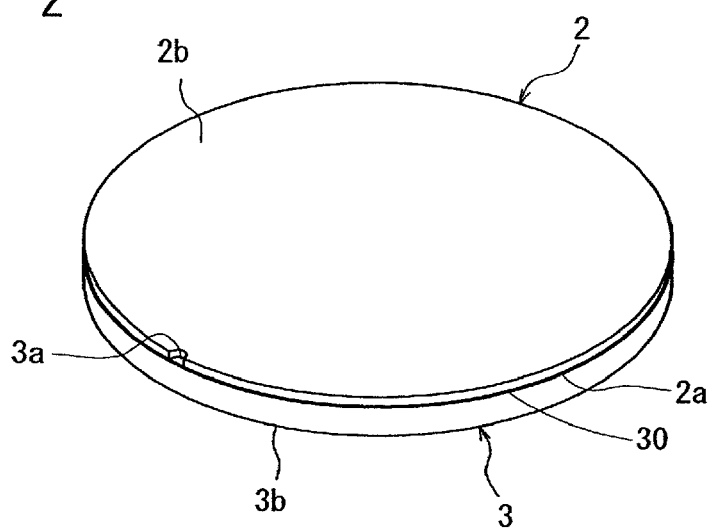
FIG. 2 is a perspective view showing a state in which the semiconductor wafer and the protective plate are integrated by performing a protective plate sticking step in the wafer dividing method according to the present invention.

The wafer 2 and the protective plate 3 formed as above are stuck to and integrated with each other by use of a pressure sensitive adhesive material 30, whose adhesive force is decreased by an external stimulus such as ultraviolet radiation, heat or the like, with the face 3a of the protective plate 3 facing the face 2a of the semiconductor wafer 2, as shown in FIG. 2 (protective plate sticking step). Thus, the semiconductor wafer 2 falls into a state in which its back 2b without formation of the devices 22 is exposed to the outside. A pressure sensitive adhesive material comprising acrylate-, ester- or urethane-based resin can be used as the pressure sensitive adhesive material 30 whose adhesive force is decreased by the external stimulus. If the glass sheet is used as the protective plate 3, the use of the pressure sensitive adhesive material, which is decreased in adhesive force by ultraviolet radiation, enables ultraviolet radiation to be thrown onto the pressure sensitive adhesive material through the protective plate 3, when the semiconductor wafer 2 and the protective plate 3 are peeled from each other, as will be described later. Thus, the semiconductor wafer 2 and the protective plate 3 can be easily peeled from each other.

Figure 3:
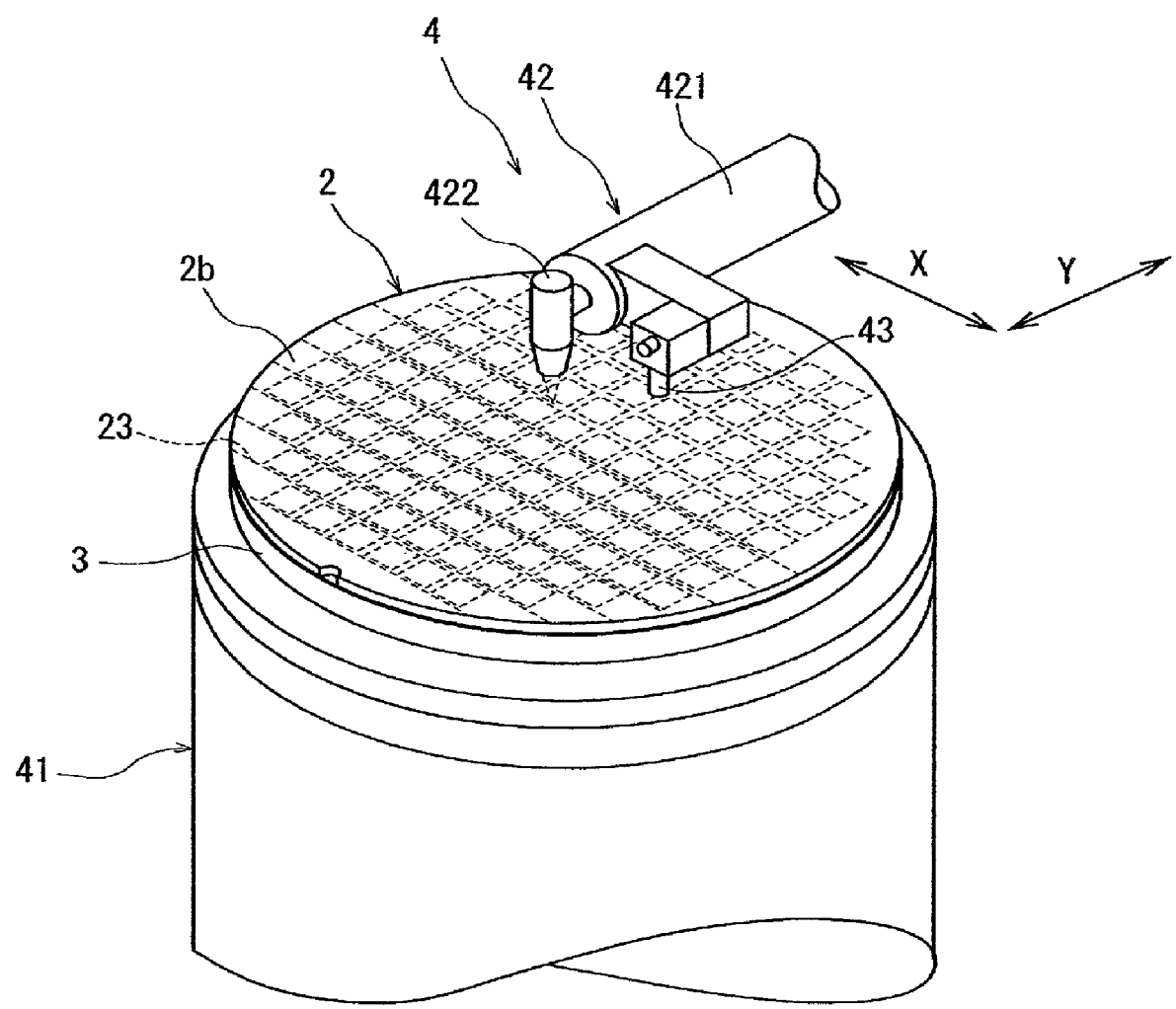
FIG. 3 is a perspective view showing essential parts of a laser processing apparatus for performing a degeneration layer formation step in the wafer dividing method according to the present invention.

Once the semiconductor wafer 2 is stuck to the protective plate 3 for integration, as described above, a degeneration layer formation step is performed in the following manner: A laser beam permeating a silicon wafer is thrown along the street 21 from the side of the back 2b of the semiconductor wafer 2. As a result, a degeneration layer of a thickness corresponding to at least the finished thickness of the device 22, the degeneration layer starting at the face 2a of the semiconductor wafer 2, is formed within the semiconductor wafer 2. This degeneration layer formation step is carried out using a laser processing apparatus shown in FIG. 3. The laser processing apparatus 4 shown in FIG. 3 is equipped with a chuck table 41 for holding a workpiece, a laser beam irradiation means 42 for throwing a laser beam onto the workpiece held on the chuck table 41, and an imaging means 43 for imaging the workpiece held on the chuck table 41. The chuck table 41 is configured to suction-hold the workpiece, and is moved by a moving mechanism (not shown) in a processing feed direction indicated by a double-headed arrow X and in an indexing feed direction indicated by a double-headed arrow Y.

The above-mentioned laser beam irradiation means 42 includes a cylindrical casing 421 placed substantially horizontally. A pulsed laser beam oscillation means provided with a pulsed laser beam oscillator comprising a YAG laser oscillator or a YVO4 laser oscillator, and a repetition frequency setting means (these components are not shown) is disposed within the casing 421. An optical focusing instrument 422 for focusing a pulsed laser beam oscillated by the pulsed laser beam oscillation means is mounted on a leading end portion of the casing 421.

The imaging means 43 mounted at the leading end portion of the casing 421 constituting the laser beam irradiation means 42 is composed, in the illustrated embodiment, of an ordinary imaging device (CCD) using visible radiation for imaging and, in addition, an infrared illumination means for irradiating the workpiece with infrared radiation, an optical system for capturing infrared radiation emitted by the infrared illumination means, and an imaging device (infrared CCD) for outputting an electrical signal conformed to infrared radiation captured by the optical system. The imaging means 43 sends an image signal produced thereby, to a control means (not shown).

To carry out the degeneration layer formation step with the use of the above-described laser processing apparatus 4, the semiconductor wafer 2 is placed on the chuck table 41 of the laser processing apparatus 4, with the protective plate 3 being pointed downward, as shown in FIG. 3. Then, the semiconductor wafer 2 is attracted to and held on the chuck table 41 by a suction means (not shown) (wafer holding step). Thus, the semiconductor wafer 2 suction-held on the chuck table 41 has its back 2b pointed upward.

After the wafer holding step is carried out in the above manner, a pulsed laser beam of a wavelength permeating the silicon wafer making up the semiconductor wafer 2 is thrown along the street 21 to the side of the back 2b of the semiconductor wafer 2 to form the degeneration layer of a thickness corresponding to the finished thickness, the degeneration layer starting at the face 2a of the semiconductor wafer 2, along the street 21 within the semiconductor wafer 2. In this manner, the degeneration layer formation step is performed. To carry out the degeneration layer formation step, the chuck table 41 suction-holding the semiconductor wafer 2 is positioned directly below the imaging means 43 by the moving mechanism (not shown). The imaging means 43 and the control means (not shown) perform an alignment operation for detecting a processing region of the semiconductor wafer 2 to be laser-processed. That is, the imaging means 43 and the control means (not shown) perform image processing, such as pattern matching, for registering the street 21 formed in a predetermined direction of the semiconductor wafer 2 with the optical focusing instrument 422 of the laser beam irradiation means 42, which throws a laser beam along the street 21, thereby performing the alignment of a laser beam irradiation position. Similarly, the alignment of the laser beam irradiation position is also performed for the street 21 extending perpendicularly to the street 21 formed in the predetermined direction of the semiconductor wafer 2 (alignment step). On this occasion, the face 2a of the semiconductor wafer 2 where the streets 21 are formed is located downward. However, the street 21 can be imaged through the back 2b, because the imaging means 43 is composed of the infrared illumination means, the optical system for capturing infrared radiation, and the imaging device (infrared CCD) for outputting an electrical signal conformed to infrared radiation, as stated above.

Figure 4:
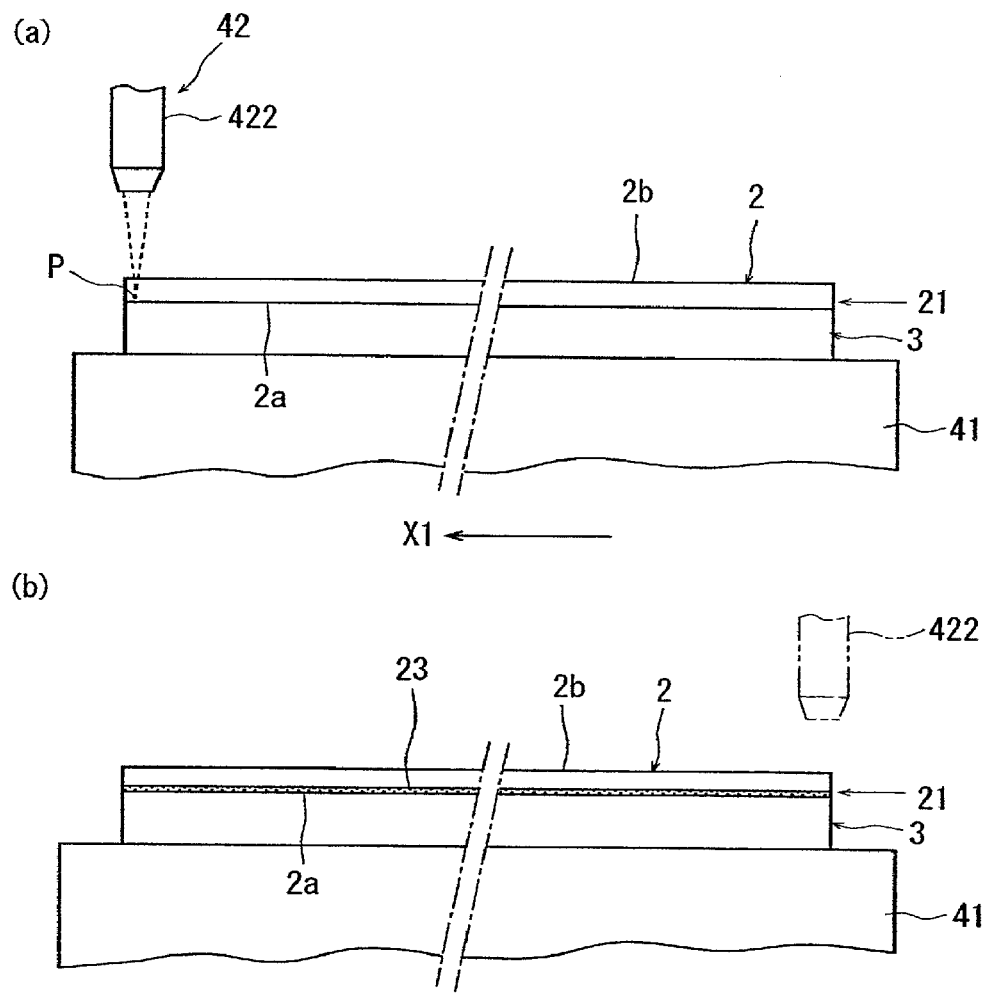
FIGS. 4(a) and 4(b) are explanatory drawings of the degeneration layer formation step in the wafer dividing method according to the present invention.

After the alignment step is performed in the above manner, the chuck table 41 is moved to a laser beam irradiation region, where the optical focusing instrument 422 of the laser beam irradiation means 42 for throwing the laser beam is located, and one end of the predetermined street 21 (left end in FIG. 4(a)) is positioned directly below the optical focusing instrument 422 of the laser beam irradiation means 42, as shown in FIG. 4(a). Then, the optical focusing instrument 422 irradiates the silicon wafer with a pulsed laser beam of a wavelength permeating the silicon wafer. Simultaneously, the chuck table 41 is moved at a predetermined feed speed in a direction indicated by an arrow X1 in FIG. 4(a). When the irradiation position of the optical focusing instrument 422 reaches the position of the other end of the street 21, as shown in FIG. 4(b), the irradiation with the pulsed laser beam is halted, and the movement of the chuck table 41 is stopped. In this degeneration layer formation step, the focused spot P of the pulsed laser beam is brought into registry with the neighborhood of the face 2a (lower surface) of the semiconductor wafer 2. As a result, a degeneration layer 23 extending upwardly and downwardly of the focused spot P is formed. In this degeneration layer formation step, the semiconductor wafer 2 is in a thick state (700 µm in the illustrated embodiment) before it is formed into the finished thickness of the device 22. Thus, the outer periphery of the semiconductor wafer 2 does not warp upward, and the focused spot of the laser beam can be easily positioned in the interior of the semiconductor wafer 2. Hence, the degeneration layer 23 can be formed reliably along the street 21 in the interior of the semiconductor wafer 2.

The processing conditions in the above-described degeneration layer formation step are set as follows:

Light source: LD-excited Q-switched Nd:YVO4 pulsed laser
Wavelength: Pulsed laser at 1064 nm
Repetition frequency: 80 kHz
Average output: 2 W
Diameter of focused spot: 1 µm
Processing feed speed: 300 mm/second Under the above-mentioned processing conditions, the thickness of the degeneration layer 23 formed at a time is of the order of about 80 µm. In the illustrated embodiment, therefore, the degeneration layer 23 having a thickness of 80 µm, starting at the face 2a (lower surface), is formed within the semiconductor wafer 2. This thickness of the degeneration layer 23 is larger than the finished thickness of the device 22 (e.g., 60 µm).

The above-described degeneration layer formation step is performed along all of the streets 21 extending in the predetermined direction in the semiconductor wafer 2, whereafter the chuck table 41 is turned through 90 degrees. Then, the above degeneration layer formation step is performed along each of the streets 21 extending in a direction perpendicular to the predetermined direction.

Figure 5:
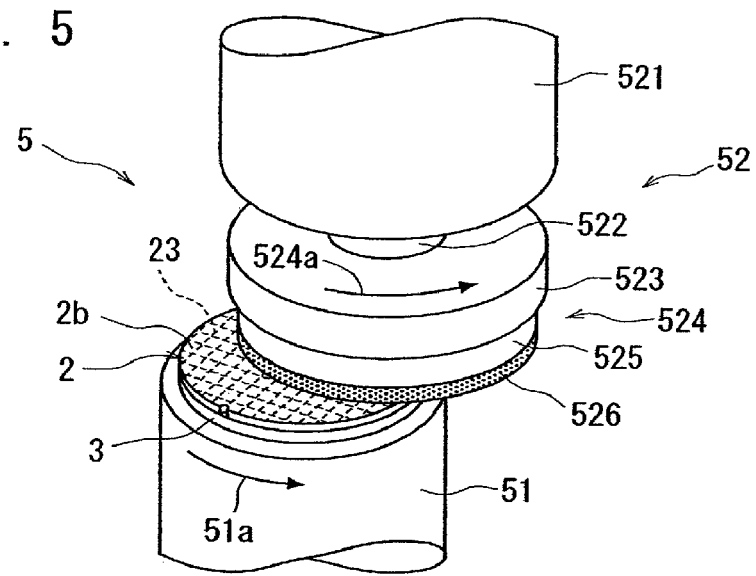
FIG. 5 is a perspective view showing essential parts of a grinding apparatus for performing a back grinding step in the wafer dividing method according to the present invention.

After execution of the above degeneration layer formation step, a back grinding step is carried out to grind the back 2b of the semiconductor wafer 2, thereby forming the semiconductor wafer 2 into the finished thickness of the device. This back grinding step is performed using a grinding apparatus shown in FIG. 5. A grinding apparatus 5 shown in FIG. 5 has a chuck table 51 for holding the wafer as a workpiece, and a grinding means 52 for grinding the processed surface of the wafer held by the chuck table 51. The chuck table 51 suction-holds the wafer on its upper surface and, in this state, is rotated in a direction indicated by an arrow 51a in FIG. 5. The grinding means 52 is furnished with a spindle housing 521, a rotating spindle 522 rotatably supported by the spindle housing 521 and rotated by a rotational drive mechanism (not shown), a mounter 523 mounted on the lower end of the rotating spindle 522, and a grinding wheel 524 mounted on the lower surface of the mounter 523. The grinding wheel 524 is composed of a disk-shaped rest 525, and a grindstone 526 mounted in an annular form on the lower surface of the rest 525. The rest 525 is attached to the lower surface of the mounter 523.

To perform the back grinding step with the use of the above-mentioned grinding apparatus 5, the protective plate 3 stuck to the semiconductor wafer 2 subjected to the aforementioned degeneration layer formation step is placed on the upper surface (holding surface) of the chuck table 51, and the semiconductor wafer 2 is suction-held on the chuck table 51. Thus, the semiconductor wafer 2 suction-held on the chuck table 51 has the back 2b pointed upward. After the semiconductor wafer 2 is suction-held on the chuck table 51 in this manner, the chuck table 51 is rotated, for example, at 300 rpm in the direction indicated by the arrow 51a, while the grinding wheel 524 of the grinding means 52 is rotated, for example, at 6000 rpm in a direction indicated by an arrow 524a. In this state, the grinding wheel 524 is brought into contact with the back 2b of the semiconductor wafer 2 to carry out grinding, whereby the semiconductor wafer 2 is formed into the finished thickness of the device 22 (for example, 60 µm). The semiconductor wafer 2 ground to the finished thickness of the device (for example, 60 µm) has the back 2b where the degeneration layer 23 formed along the street 21 is exposed. By performing the back grinding step as noted above, the semiconductor wafer 2 is formed to have a thickness as small as, for example, 60 µm. However, the semiconductor wafer 2 does not break during its transport from the grinding apparatus 5 to the next step, since it is stuck to the protective plate 3.

Figure 6:
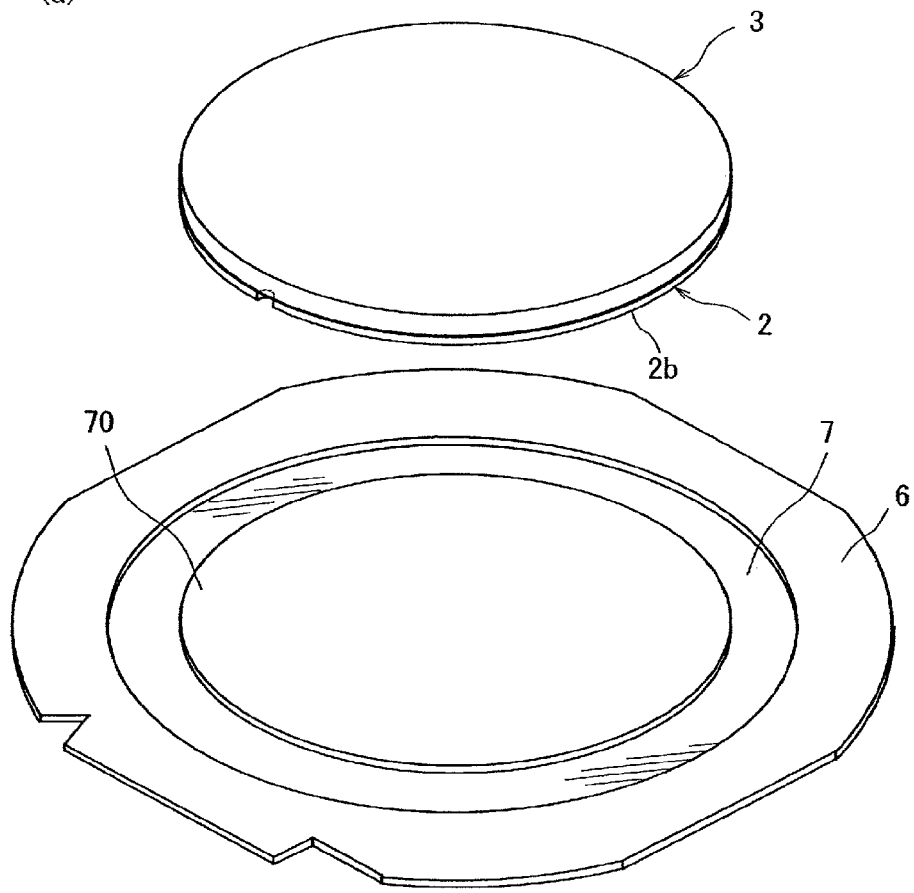
FIGS. 6(a) and 6(b) are explanatory drawings of a wafer support step in the wafer dividing method according to the present invention.
Figure 6:
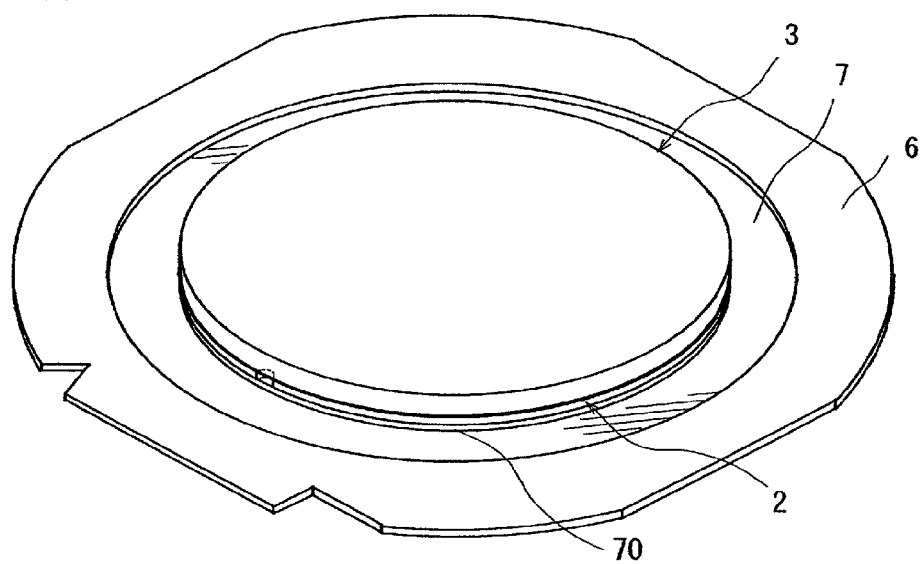

After the back grinding step is performed in the above-described manner, a wafer support step is carried out to stick the back 2b of the semiconductor wafer 2 to the surface of a dicing tape mounted on an annular frame. That is, in an embodiment shown in FIGS. 6(a) and 6(b), the back 2b of the semiconductor wafer 2 is mounted on an adhesive film 70 for die bonding which is stuck to the surface of a dicing tape 7 having an outer peripheral portion mounted on an annular frame 6 so as to cover an inward opening of the annular frame 6. On this occasion, the adhesive film 70, while being heated at a temperature of 80 to 200° C., is pressed against the back 2b of the semiconductor wafer 2, and mounted thereby.

Figure 7:
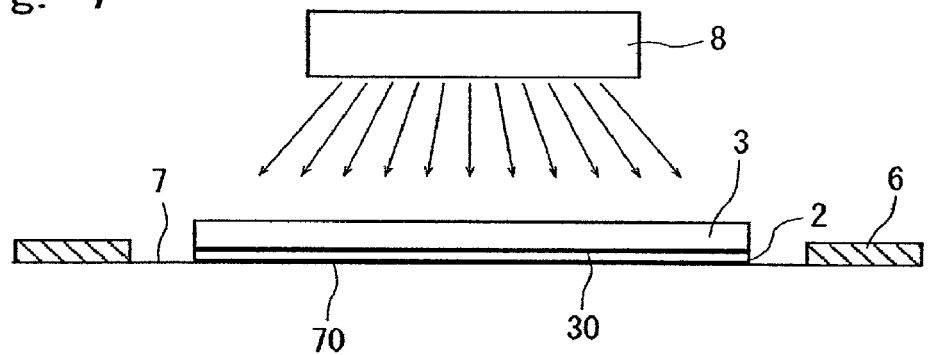
FIG. 7 is an explanatory drawing of an adhesive force decreasing step in the wafer dividing method according to the present invention.

After execution of the above-described wafer support step, an adhesive force decreasing step is performed to impart an external stimulus to the pressure sensitive adhesive material 30, by which the semiconductor wafer 2 stuck to the surface of the dicing tape 7 has been stuck to the protective plate 3, thereby decreasing the sticking force of the pressure sensitive adhesive material 30. That is, in an embodiment shown in FIG. 7, an ultraviolet irradiator 8 throws ultraviolet radiation to the side of the protective plate 3 to which the face 2a of the semiconductor wafer 2 has been stuck. The ultraviolet radiation applied by the ultraviolet irradiator 8 is directed at the pressure sensitive adhesive material 30 through the protective plate 3 comprising the glass sheet. As a result, the adhesive force of the pressure sensitive adhesive material 30 is decreased, because the pressure sensitive adhesive material 30 is formed from a pressure sensitive adhesive whose adhesive force is decreased when given an external stimulus such as ultraviolet radiation, as stated earlier.

Figure 8:
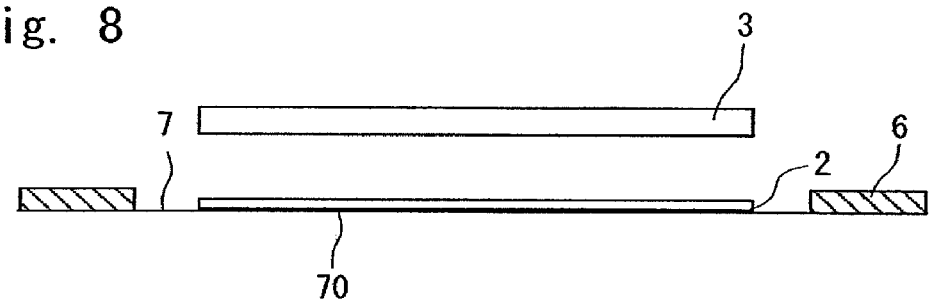
FIG. 8 is an explanatory drawing of a protective plate peeling step in the wafer dividing method according to the present invention.

After execution of the above-described adhesive force decreasing step, a protective plate peeling step is performed to peel the protective plate 3 from the face 2a of the semiconductor wafer 2. That is, the adhesive force of the pressure sensitive adhesive material 30 has been decreased by performing the above adhesive force decreasing step. Thus, the protective plate 3 can be easily peeled from the face 2a of the semiconductor wafer 2, as shown in FIG. 8.

Figure 9:
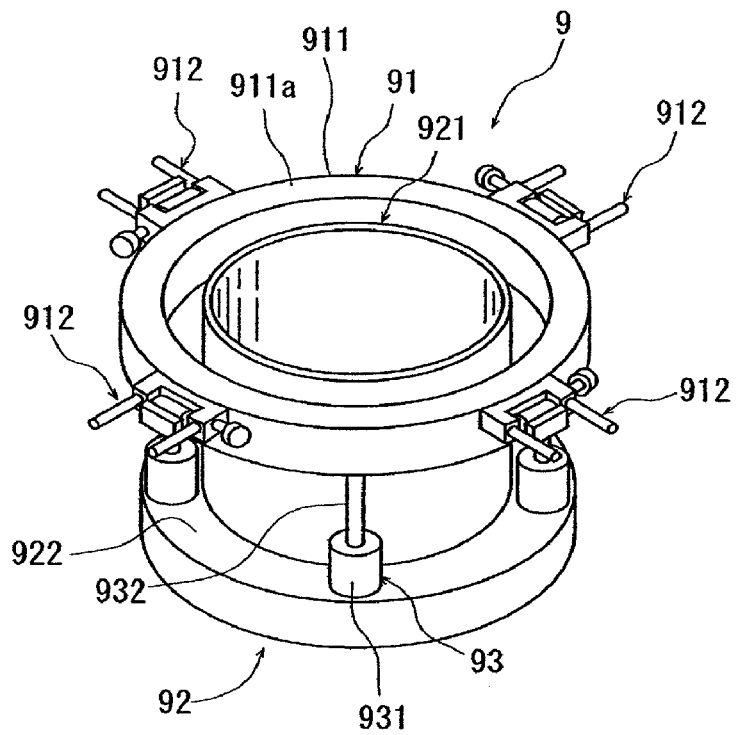
FIG. 9 is a perspective view of a tape enlarging device for performing a wafer rupture step in the wafer dividing method according to the present invention.

After execution of the above protective plate peeling step, a wafer rupture step is performed to impart an external force to the semiconductor wafer 2 stuck to the dicing tape 7 mounted on the annular frame 6, thereby rupturing the semiconductor wafer 2 along the street 2 where the degeneration layer 23 has been formed. This wafer rupture step is carried out, in the illustrated embodiment, with the use of a tape enlarging apparatus 9 shown in FIG. 9. The tape enlarging apparatus 9 shown in FIG. 9 is equipped with a frame holding means 91 for holding the annular frame 6, and a tape enlarging means 92 for enlarging the dicing tape 7 mounted on the annular frame 6 held by the frame holding means 91. The frame holding means 91 is composed of an annular frame holding member 911, and a plurality of clamps 912, as a fixing means, disposed on the outer periphery of the frame holding member 911. An upper surface of the frame holding member 911 defines a bearing surface 911a for bearing the annular frame 6, and the annular frame 6 is placed on the bearing surface 911a. The annular frame 6 placed on the bearing surface 911a is fixed to the frame holding member 911 by the clamps 912. The frame holding means 91 constituted in this manner is supported by the tape enlarging means 92 to be movable upward and downward.

The tape enlarging means 92 is furnished with an enlarging drum 921 disposed inwardly of the annular frame holding member 911. The enlarging drum 921 has an inner diameter and an outer diameter which are smaller than the inner diameter of the annular frame 6, but larger than the outer diameter of the semiconductor wafer 2 stuck to the dicing tape 7 mounted on the annular frame 6. The enlarging drum 921 has a support flange 922 at its lower end. The tape enlarging means 92 in the illustrated embodiment is equipped with a support means 93 capable of moving the annular frame holding member 911 upward and downward. The support means 93 is composed of a plurality of air cylinders 931 disposed on the support flange 922, and has each of their piston rods 932 coupled to a lower surface of the annular frame holding member 911. The support means 93 composed of the plurality of air cylinders 931 moves the annular frame holding member 911 upward and downward between a reference position at which the bearing surface 911a is located at nearly the same height as the upper end of the enlarging drum 921, and an enlargement position at which the bearing surface 911a is lower than the upper end of the enlarging drum 921 by a predetermined amount. Thus, the support means 93 composed of the plurality of air cylinders 931 functions as an enlarging movement means which moves the enlarging drum 921 and the frame holding member 911 upward and downward relative to each other.

Figure 10:
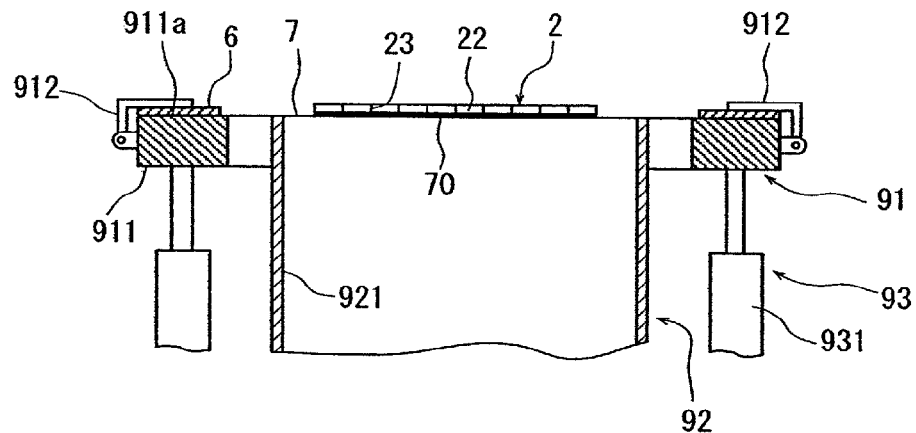
FIGS. 10(a) and 10(b) are explanatory drawings of the wafer rupture step in the wafer dividing method according to the present invention.
Figure 10:
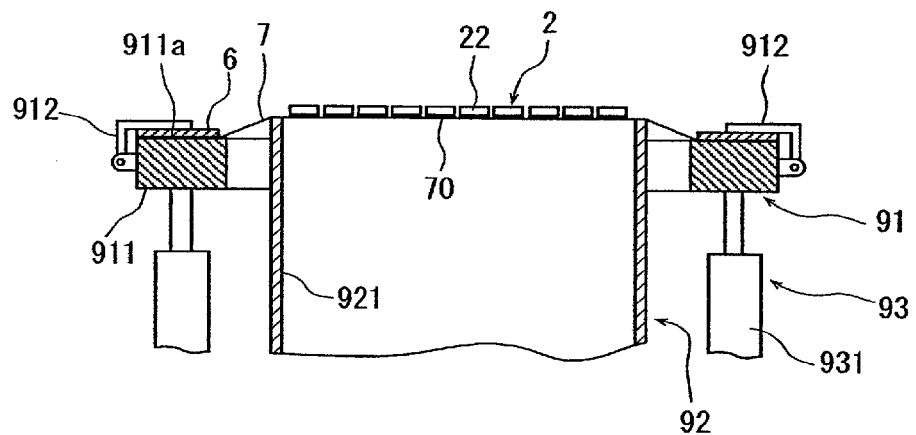

The wafer rupture step, which is performed using the tape enlarging apparatus 9 configured as above, will be described with reference to FIGS. 10(a) and 10(b). That is, the annular frame 6 mounted with the dicing tape 7 stuck with the back 2b of the semiconductor wafer 2 (where the degeneration layers 23 are formed along the streets 21) is placed on the bearing surface 911a of the frame holding member 911 constituting the frame holding means 91, and is fixed to the frame holding member 911 by the clamps 912, as shown in FIG. 10(a). At this time, the frame holding member 911 is located at the reference position shown in FIG. 10(a). Then, the plurality of air cylinders 931, as the support means 93 constituting the tape enlarging means 92, are actuated to move the annular frame holding member 911 downward to the enlargement position shown in FIG. 10(b). Thus, the annular frame 6 fixed onto the bearing surface 911a of the frame holding member 911 also descends, so that the dicing tape 7 mounted on the annular frame 6 is enlarged upon contact with the upper edge of the enlarging drum 921, as shown in FIG. 10(b). As a result, a tensile force acts radially on the semiconductor wafer 2 stuck to the dicing tape 7. Thus, the semiconductor wafer 2 is ruptured along the streets 21, where the strength has been decreased because of the formation of the degeneration layers 23, and is thus divided into the individual devices 22. At this time, the adhesive film 70 for die bonding, which has been mounted on the back 2b of the semiconductor wafer 2, is also ruptured along the individual devices 22.

Figure 11:
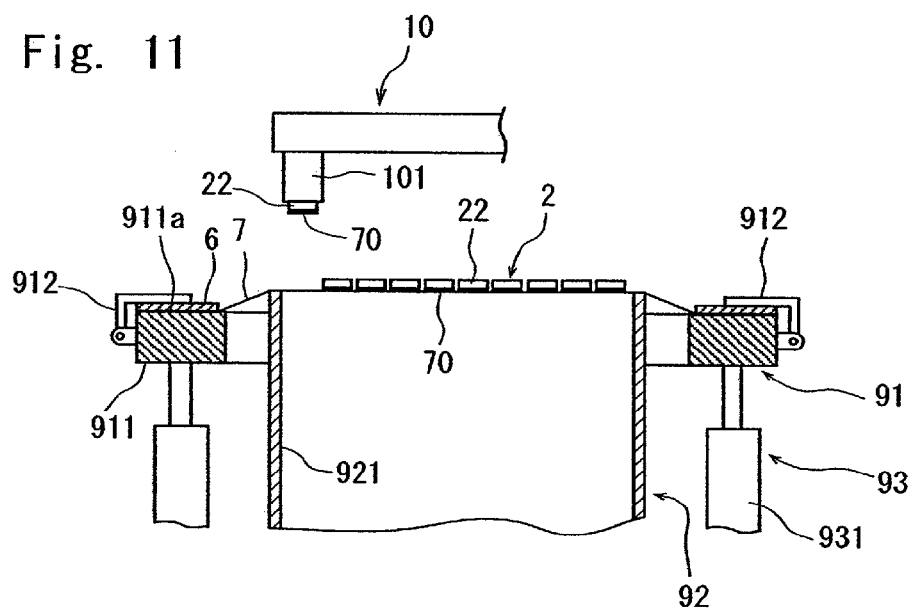
FIG. 11 is an explanatory drawing showing a pickup step for picking up devices separated by the wafer dividing method according to the present invention.

After the wafer rupture step is carried out in the above manner, a pickup mechanism 10 is actuated to pick up the device 22 located at a predetermined position by a pickup collet 101 (pickup step) as shown in FIG. 11. The device 22 so picked up, on whose back the adhesive film 70 for die bonding has been mounted, is transported to a tray (not shown) or a die bonding step.

What is claimed is:

1. A wafer dividing method for dividing a wafer, which has devices formed in a plurality of regions demarcated by a plurality of streets formed in a lattice pattern on a surface of the wafer, into the individual devices along the plurality of streets, comprising:

a protective plate sticking step of sticking the face of the wafer to a face of a protective plate by a pressure sensitive adhesive material whose adhesive force is decreased by an external stimulus;

a degeneration layer formation step of throwing a laser beam, which permeates the wafer, along the street to a back side of the wafer having the face stuck to the protective plate, thereby forming a degeneration layer of a thickness corresponding to at least a finished thickness of the device within the wafer, the degeneration layer starting at the face of the wafer;

a back grinding step of grinding a back of the wafer subjected to the degeneration layer formation step, to form the wafer into the finished thickness of the device;

a wafer support step of sticking the back of the wafer subjected to the back grinding step to a surface of a dicing tape mounted on an annular frame;

an adhesive force decreasing step of imparting an external stimulus to the pressure sensitive adhesive material sticking the wafer, which was subjected to the wafer support step and has been stuck to the surface of the dicing tape, to the protective plate, thereby decreasing the adhesive force of the pressure sensitive adhesive material;

a protective plate peeling step of peeling the protective plate from the face of the wafer after execution of the adhesive force decreasing step; and a wafer rupture step of imparting an external force to the wafer stuck to the dicing tape after execution of the protective plate peeling step, thereby rupturing the wafer along the street where the degeneration layer has been formed, wherein during the wafer support step, an adhesive film for die bonding is interposed between the surface of the dicing tape and the back of the wafer.

2. The wafer dividing method according to claim 1, wherein the adhesive force decreasing step applies an external stimulus to a side of the protective plate to which the face of the wafer has been stuck.

\* \* \* \* \*